United States Patent
Lee et al.

(10) Patent No.: US 8,033,401 B2
(45) Date of Patent: Oct. 11, 2011

(54) WAFER GUIDE FOR PREVENTING WAFER BREAKAGE IN SEMICONDUCTOR CLEANING APPARATUS

(75) Inventors: Hea-Woong Lee, Gyeongg-do (KR); Chang-Gil Ryu, Gyeonggi-do (KR); Byoung-Moon Yoon, Gyeonggi-do (KR); Yong-Myung Jun, Gyeonggi-do (KR); Kang-Hee Han, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 457 days.

(21) Appl. No.: 12/209,897

(22) Filed: Sep. 12, 2008

(65) Prior Publication Data
US 2009/0067960 A1 Mar. 12, 2009

(30) Foreign Application Priority Data
Sep. 12, 2007 (KR) .................. 10-2007-0092354

(51) Int. Cl.
*A47G 19/08* (2006.01)
(52) U.S. Cl. .................................. 211/41.18
(58) Field of Classification Search ............... 211/41.18, 211/40, 41.12, 183; 206/710, 454, 832; 414/935
See application file for complete search history.

(56) References Cited

U.S. PATENT DOCUMENTS

| | | | | |
|---|---|---|---|---|
| 3,610,613 A | * | 10/1971 | Worden | 269/254 R |
| 4,993,559 A | * | 2/1991 | Cota | 211/41.18 |
| 5,301,700 A | | 4/1994 | Kamikawa et al. | |
| 5,370,142 A | * | 12/1994 | Nishi et al. | 134/61 |
| 5,429,251 A | * | 7/1995 | Matthews | 211/41.18 |
| 5,503,173 A | * | 4/1996 | Kudo et al. | 134/201 |
| 5,566,076 A | | 10/1996 | Kuroda | |
| 5,590,672 A | * | 1/1997 | Ohmori et al. | 134/201 |
| 6,039,187 A | * | 3/2000 | Mendiola | 206/711 |
| 6,041,938 A | * | 3/2000 | Senn | 206/711 |
| 6,245,147 B1 | * | 6/2001 | Kobayashi | 118/500 |
| 6,520,191 B1 | * | 2/2003 | Iwamoto et al. | 134/184 |

(Continued)

FOREIGN PATENT DOCUMENTS
JP 8-46009 2/1996
(Continued)

OTHER PUBLICATIONS

English language abstract of Japanese Publication No. 8-46009.
(Continued)

*Primary Examiner* — Jennifer E. Novosad
(74) *Attorney, Agent, or Firm* — Stanzione & Kim, LLP

(57) ABSTRACT

A wafer guide for preventing a wafer breakage in a semiconductor cleaning apparatus includes a lower supporter, side supporters, fixing units and stoppers. The lower supporter is provided with a plurality of slots formed with the same interval in a length direction to vertically stand a plurality of wafers thereon. The side supporters are structured and arranged in parallel at each side above the lower supporter. The side supporters support side end parts of the wafers. The fixing units are adapted to support both end parts of the lower supporter and the side supporters, and may be fixed to a bath. The stoppers are individually coupled to each of the fixing units. The stoppers are operable to generate an error in a close operation of holder units of the robot chuck when the robot chuck deviates from a normal alignment range, so as not to perform a wafer chucking, thereby preventing a wafer breakage during the wafer chucking.

13 Claims, 8 Drawing Sheets

U.S. PATENT DOCUMENTS

| | | | |
|---|---|---|---|
| 6,571,964 B2 * | 6/2003 | Jacobson et al. | 211/41.12 |
| 6,871,657 B2 * | 3/2005 | Bottos et al. | 134/115 R |
| 6,939,132 B2 * | 9/2005 | Loo | 432/258 |
| 7,270,240 B2 * | 9/2007 | Niese et al. | 211/41.18 |
| 7,661,544 B2 * | 2/2010 | Herzog | 211/41.18 |
| 2002/0092815 A1 * | 7/2002 | Kim et al. | 211/41.18 |
| 2003/0085186 A1 * | 5/2003 | Fujioka et al. | 211/41.18 |
| 2003/0121870 A1 * | 7/2003 | Beckhart et al. | 211/41.18 |
| 2003/0178379 A1 * | 9/2003 | Hasegawa et al. | 211/41.18 |
| 2004/0022607 A1 * | 2/2004 | Lim et al. | 414/222.01 |
| 2005/0145584 A1 * | 7/2005 | Buckley et al. | 211/41.18 |
| 2006/0027513 A1 * | 2/2006 | Jun et al. | 211/41.18 |
| 2007/0125726 A1 * | 6/2007 | Seo | 211/41.18 |
| 2008/0000851 A1 * | 1/2008 | Pickering et al. | 211/41.18 |
| 2008/0237157 A1 * | 10/2008 | Chin et al. | 211/41.18 |
| 2009/0008346 A1 * | 1/2009 | Aihara et al. | 211/41.18 |

FOREIGN PATENT DOCUMENTS

KR   2005-0023533   3/2005

OTHER PUBLICATIONS

English language abstract of Korean Publication No. 2005-0023533.

* cited by examiner

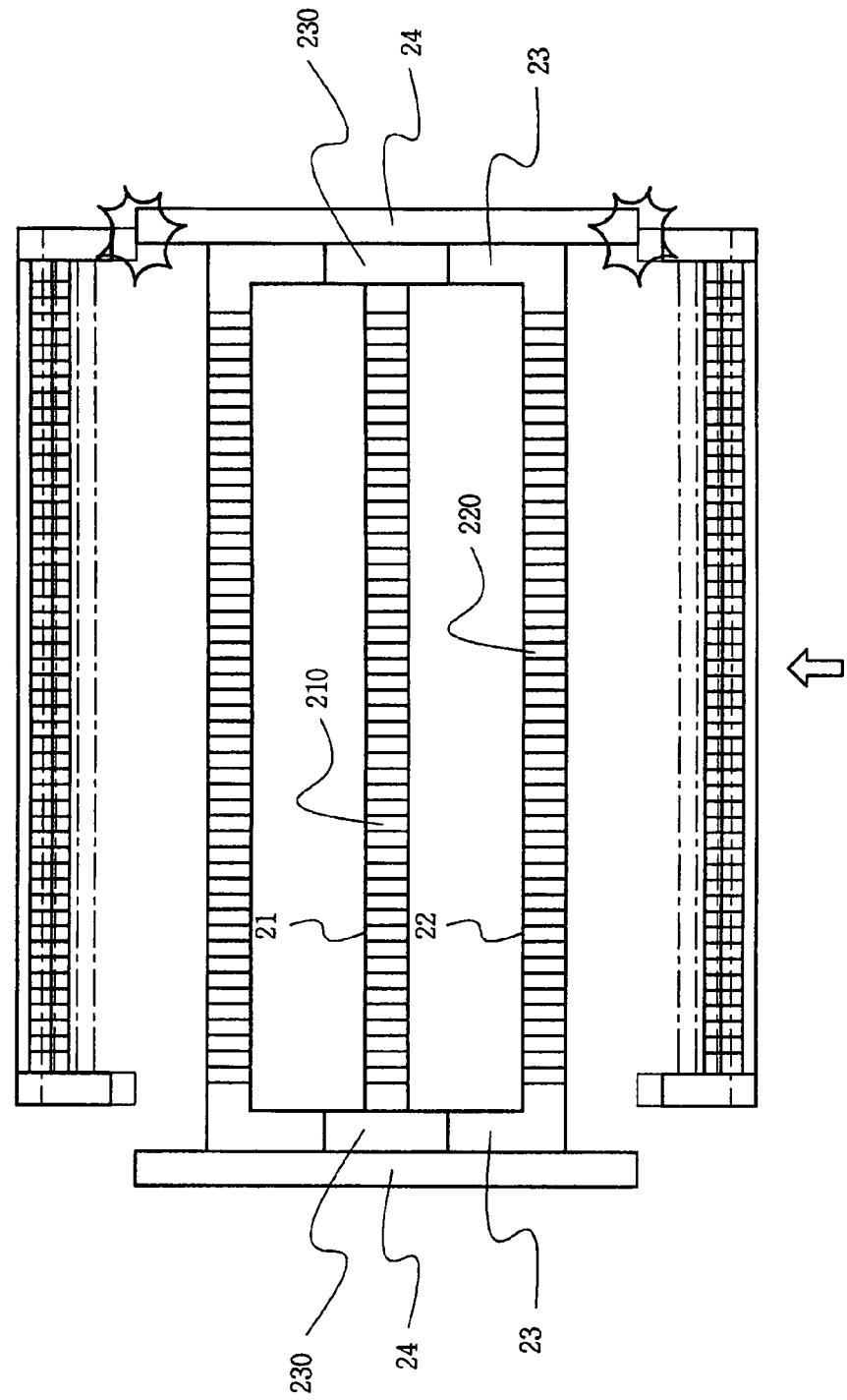

WAFER GUIDE FOR PREVENTING WAFER BREAKAGE IN SEMICONDUCTOR CLEANING APPARATUS

CROSS REFERENCE TO RELATED APPLICATIONS

This application claims priority under 35 U.S.C. §119 from Korean Patent Application 10-2007-0092354, filed on Sep. 12, 2007, the contents of which are hereby incorporated by reference.

BACKGROUND OF THE INVENTION

1. Field of the Invention

The present invention relates to semiconductor cleaning apparatuses, and more particularly, to a wafer guide for use in a semiconductor cleaning apparatus, which is capable of preventing a wafer breakage and process error.

2. Description of the Related Art

Semiconductor devices are becoming larger in size and higher in density. As a result, impurity particles or micro-pollution particles of a wafer generated in etching or ion implantation, diffusion processes, etc., considerably influence a production yield. Accordingly a cleaning process for eliminating various pollution materials of wafers produced in semiconductor manufacturing processes is essential to the manufacturing of semiconductor devices.

Conventionally, a wet cleaning process may be used to remove micro-pollution particles such as metal impurities and organic materials from wafers. The wet cleaning process may remove pollution materials by soaking wafers in baths filled with ultra-pure chemicals such as sulfuric acid, hydrochloric acid, and ammonium, etc.

Wafers are generally transferred by a robot chuck. For example, about 50 sheets of wafers grouped as a batch unit from a cassette are chucked and transferred to respective baths using the robot chuck. The grouped wafers are chucked and transferred as a batch unit to a wafer guide adapted inside the respective baths. Specifically, the wafers chucked in batch from a cassette are transferred to a wafer guide that is adapted within a bath using the robot chuck, and a cleaning process is performed in the wafer guide using the chemicals. Then the wafers are transferred to a subsequent process using the robot chuck.

Slots are formed in respective support arms to support wafers of the robot chuck and the wafer guide. The slots are formed with substantially the same interval and in the same number, and each wafer sheet is inserted into each slot, respectively. That is, slots of the same number as the batch unit are formed in the support arm of the robot chuck and the wafer guide to support wafers in the batch unit.

In the robot chuck, support arms are adapted at both sides in parallel with each other so as to individually and simultaneously rotate pivotally on one side thereof in mutually opposite directions. Thus, lower end parts of both support arms become mutually near or far in distance during an open/close operation.

In the robot chuck, support arms of both sides first perform an open operation so as to approach the wafers, and then the support arms of both sides perform a close operation so as to chuck the wafers therein. While in the state of having chucked the wafers therein, the support arms move to approach a wafer guide or cassette. Subsequently, the wafers are transferred in a batch unit to the wafer guide or cassette by again performing an open operation of both support arms.

However, when the robot chuck moves to the wafer guide where previously cleaned wafers are stacked, the support arms of the robot chuck and the wafer guide must be located so that slots are placed on the same vertical lines. For example, when the robot chuck deviates from a predetermined loading position, the slots of the robot chuck and the wafer guide are not precisely matched to one another. Thus, in a chucking step of unloading wafers from the wafer guide by the robot chuck, a portion of the wafers may not be exactly inserted into slots of the robot chuck, and the wafers abnormally chucked in the robot chuck may be broken. The wafers may break in a wafer guide side by a strong chucking pressure of the robot chuck.

Further, for example, when the process continues in the state where the broken wafer remains intact in the wafer guide, wafers that are subsequently loaded into the wafer guide by the robot chuck are transferred to the wafer guide. As a result, additional wafers cannot be sufficiently inserted into slots due to the broken wafer parts remaining in the wafer guide. This causes a relatively severe process defect.

When the process is interrupted owing to such wafer breakage and process defect, much time is consumed to recover the interrupted process. In addition, defective products are created, thereby causing a decrease in productivity.

SUMMARY OF THE INVENTION

Some embodiments of the invention provide a wafer guide for preventing a wafer from being broken in a semiconductor cleaning apparatus by generating an error in a close operation of a robot chuck to chuck wafers therein when the robot chuck deviates from a predetermined loading position in a loading step of the robot chuck to load/unload a plurality of wafers based on a batch unit. A loss in subsequently loaded wafers causable by one first broken wafer can be prevented by preventing the wafer breakage in the wafer chucking step. In addition, a process interruption causable by a wafer breakage can be prevented, thereby substantially increasing a process efficiency and productivity.

According to an embodiment of the invention, a wafer guide for preventing a wafer from being broken in a semiconductor cleaning apparatus comprises a lower supporter having a plurality of slots formed therein, each slot having substantially the same interval in a length direction to vertically stand a plurality of wafers thereon; side supporters that are structured and arranged in parallel at each side of a same horizontal line above the lower supporter, the side supporters having a same number of slots formed therein as the lower supporter, the side supporters having substantially the same interval in the length direction as the lower supporter, the side supporters being structured to support side end parts of the wafers; fixing units that are structured and arranged to support end parts of the lower supporter and the side supporters, and to fix the wafer guide to a bath; and stoppers that are individually coupled to each of the fixing units, the stoppers being operable to generate an error in a close operation of holder units of a robot chuck.

As described above, according to some embodiments of the invention, when chucking wafers from a wafer guide using a robot chuck promptly after cleaning the wafers supported by the wafer guide inside a bath, the robot chuck is deviated from an exact chucking point. Responsive to the deviation, a close operation of the robot chuck to chuck the wafers is stopped by a stopper and thus an error operation of the robot chuck can be sensed before chucking the wafers. The process is interrupted, thereby preventing wafers from being broken in a large quantity.

Further, error operation of a robot chuck can be solved prior to wafer breakage occurrences, thereby substantially reducing a process interruption time and substantially increasing process efficiency and productivity.

BRIEF DESCRIPTION OF THE DRAWINGS

The above and other features of some embodiments of the invention will become readily apparent from the description that follows, with reference to the attached drawings in which:

FIG. 8 is plan view illustrating a close operating error state of robot chuck according to an embodiment of the invention.

DETAILED DESCRIPTION

Embodiments of the present invention now will be described more fully hereinafter with reference to the accompanied drawings, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to the accompanied drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
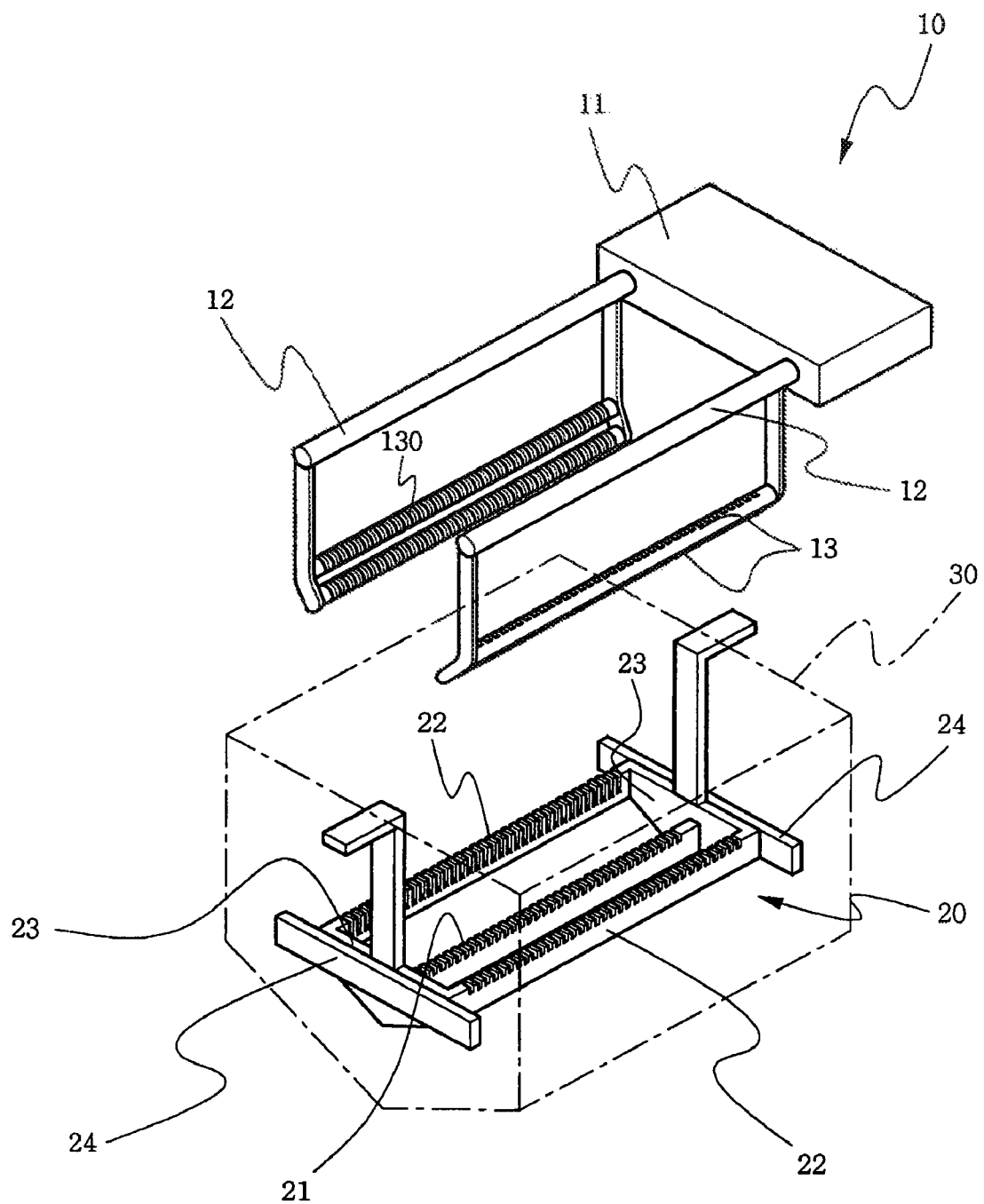
FIG. 1 is a perspective view illustrating a batch type wet cleaning apparatus provided with a wafer guide according to an embodiment of the invention.

FIG. 1 is a perspective view illustrating a batch type wet cleaning apparatus provided with a wafer guide according to an embodiment of the invention. In the batch type wet cleaning apparatus, a robot chuck 10 comprises an elevating unit 11, rotary units 12 and holder units 13.

The elevating unit 11 is configured to move vertically by a predefined length through use of an elevation scheme (not shown). A motor providing a clockwise/counterclockwise rotation may be used in the elevation scheme of the elevating unit 11. The rotary units 12 are structured and arranged in parallel with a predefined interval therebetween on substantially the same horizontal position in one side surface of the elevating unit 11. Respective rotary units 12 combined with the elevating unit 11 are configured to rotate in mutually opposite directions. A drive unit (not shown) for individually rotating the rotary units in mutually opposite directions is structured and arranged inside the elevating unit 11. A cylinder may be used as a driving unit for the rotating rotary units 12.

The holder unit 13 is structured and arranged in a lower part of each rotary unit 12, and on mutually opposite surfaces thereof. Slots 130 are formed with a predefined interval in a length direction, into which a circumference portion of a wafer can be inserted. The holder unit 13 is adapted to actually chuck the wafers thereon. The wafers may be individually inserted into respective slots 130. As a result, the wafers based on a batch unit can be chucked therein.

A distance between the holder units 13 becomes widened or narrowed in an open/close operation performed through a driving apparatus (not shown) of the rotary unit 12. The wafers based on a batch unit are chucked once or the chucked wafers are transferred at the same time by the open/close operation of the holder unit 13.

On the other hand, in the elevating unit 11, a sensor (not shown) may promptly sense an error of operation when an error occurs in the open/close operation of the holder unit 13. An error signal sensed through the sensor is transferred to a controller (not shown) to stop the driving apparatus of the rotary unit 12 responsive to the error signal.

The robot chuck referred to in FIG. 1 illustrates one of various examples, and the holder unit 13 may be adapted as respective ones of both sides or as a pair of upper and lower parts. Wafers chucked by the robot chuck 10 may be loaded into a wafer guide 20 adapted inside a bath 30. The wafer guide 20 comprises a lower supporter 21, side supporter 22, and a fixing unit 23 as shown in FIG. 1. The wafer guide 20 may be configured so that a plurality of wafers chucked by a batch unit in the robot chuck 10 are simultaneously mounted and are cleaned inside the bath 30. In addition, a stopper 24 may be formed in one body with the wafer guide 20. Thus, the wafer guide 20 may be constructed of a combination of the lower supporter 21, the side supporter 22, the fixing unit 23, and the stopper 24.

Figure 2:
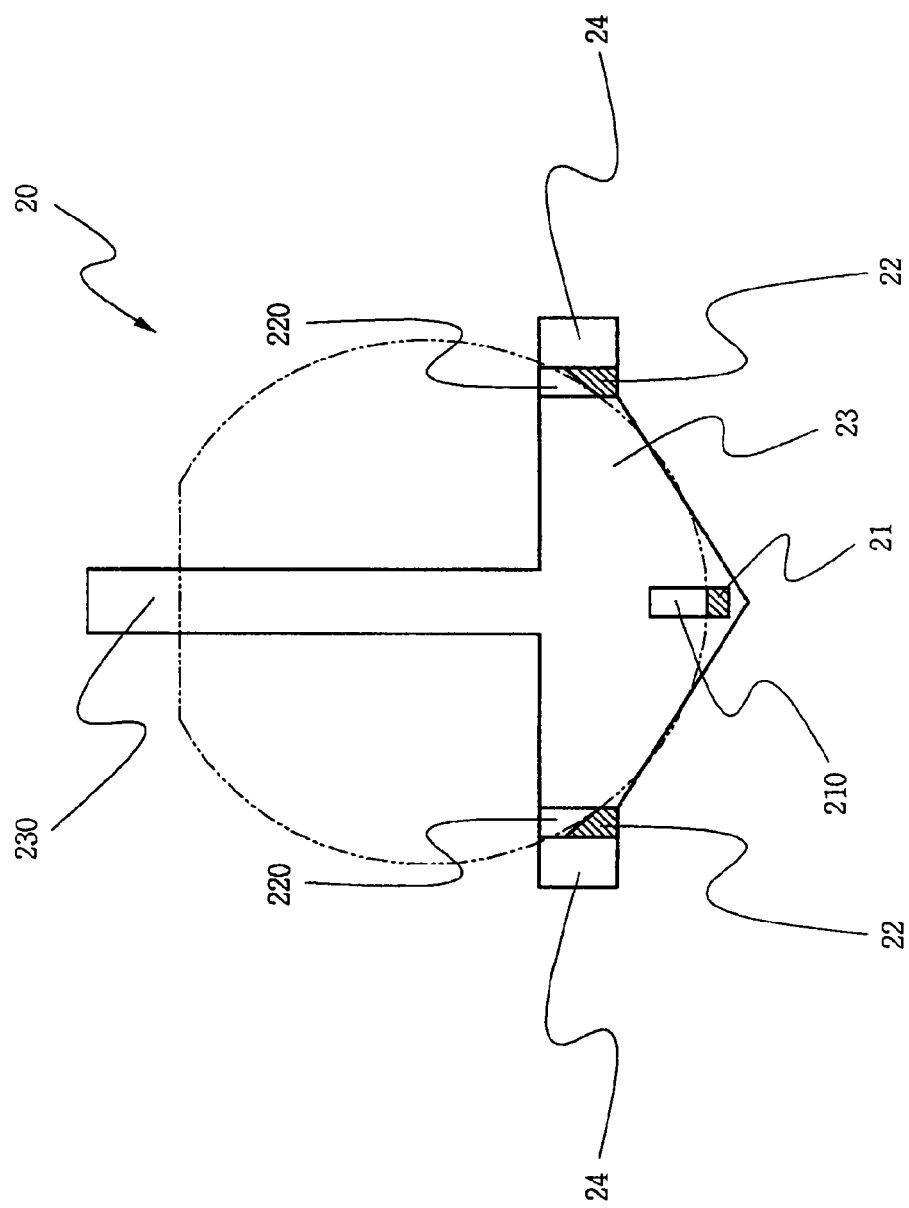
FIG. 2 is a sectional view illustrating a vertical section of a wafer guide according to an embodiment of the invention.
Figure 3:
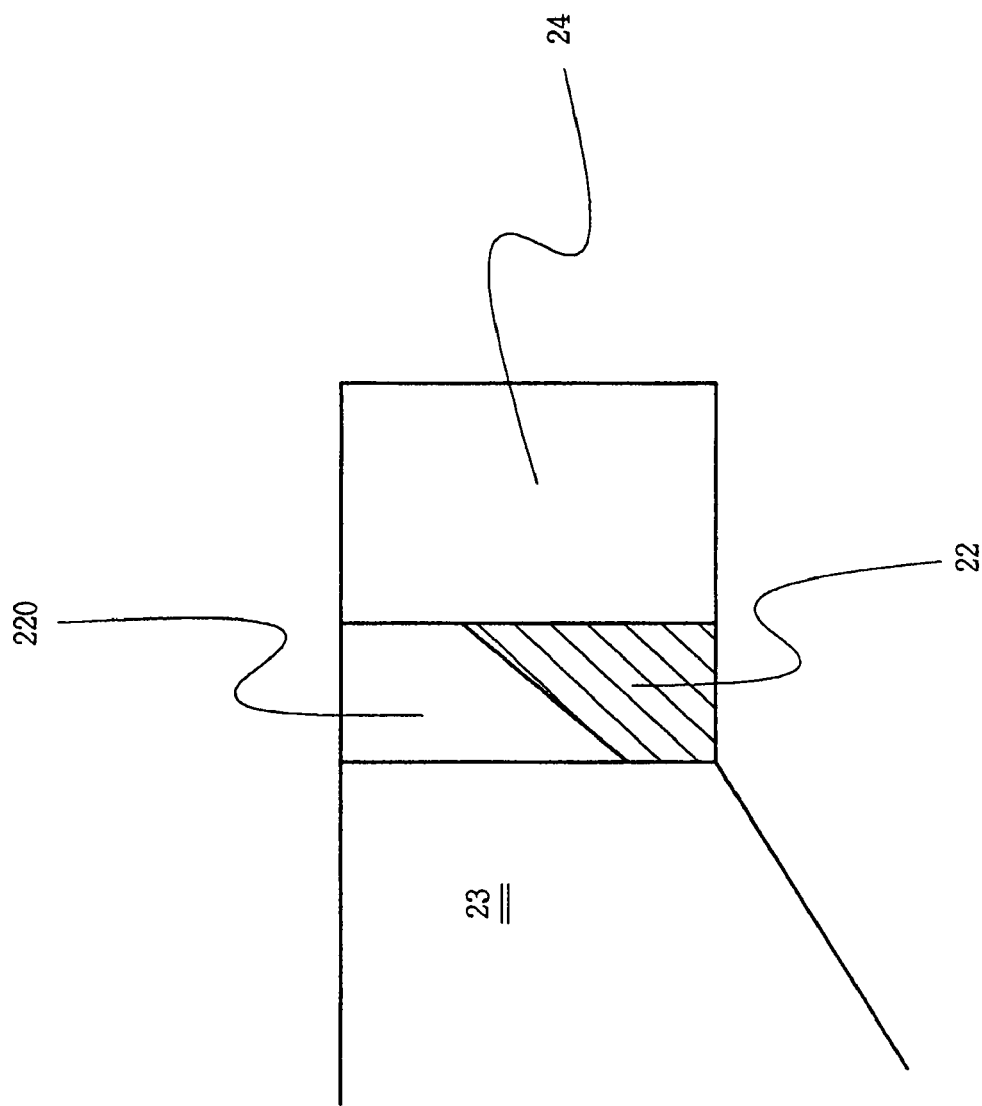
FIG. 3 is an enlarged view illustrating main parts of a wafer-mounted face of a slot adapted in the side supporter of a wafer guide.

FIG. 2 is a sectional view illustrating a vertical section of a wafer guide according to an embodiment of the invention. FIG. 3 is an enlarged view illustrating main parts of a wafer-loading face of slots formed in the side supporter of a wafer guide.

The wafer guide 20 may be structured and arranged to vertically stand and mount a plurality of wafers transferred in a batch unit from the robot chuck 10, and in this state, the wafers are cleaned using a cleaning solution filled in the bath. The wafer guide 20 is constructed of a plurality of support structures to stably mount the plurality of wafers transferred by the robot chuck 10 from an upper side. In the wafer guide, the lower supporter 21 and the side supporter 22 are to actually support wafers, and the fixing unit 23 supports both end parts of the lower supporter 21 and the side supporter 22 so as to be stably fixed into the bath.

The lower supporter 21 is structured to support a lower end part of the wafer, and the side supporter 22 is structured to support a side surface of a lower side of a wafer. The lower supporter 21 may be configured so that a center lower end part of a wafer standing vertically is supported, and on an upper surface thereof, slots 210 having a width larger than a thickness of wafer may be formed.

The number and width of slots 210 formed in the lower supporter 21 may be the same as the number and width of slots 130 formed in the holder unit 13 of the robot chuck 10. Thus, wafers of a batch unit transferred by the robot chuck 10 can be mounted at the same time.

The side supporters 22 are structured and arranged in parallel at both sides on substantially the same horizontal line above the lower supporter 21, and support a lower side surface of one or more wafers. That is, the side supporter 22 supports a side surface of a lower part rather than a portion of the wafer supported by the holder unit 13 of the wafer chuck 10.

In the side supporters 22 of both sides, the same numbers of slots 220 may be formed having substantially the same width and interval on the same vertical line as the lower supporter 21. The slots 220 in the side supporter 22 are formed with a depth enough to contact with an outer circumference surface of a wafer, and in particular, the bottom surface of each slot 220 is formed downward tilted into an inner side to stably keep the contact with the wafer as shown in FIG. 3. The slots 220 may be formed to have substantially the same curved surface as an outer circumference surface of a wafer.

Thus, in the wafer guide 20 according to an embodiment of the invention, the lower supporter 21 and the side supporters 22 may be formed to have substantially the same length, and the wafers may be provided in a way that a portion of outer circumference of the wafers is simultaneously inserted into respective slots 210 and 220 of the lower supporter 21 and the side supporters 22, respectively, so that the wafers stand vertically.

The fixing unit 23 is structured and arranged to keep in parallel the lower supporter 21 and the side supporters 22 of both sides with a predefined interval and stably fix them inside the bath 30. Both end parts of the lower supporter 21 and the side supporters 22 are solidly coupled to the fixing unit 23. An upper end part of the fixing unit 23 is formed as a protrusion part 230 in one body with the fixing unit 23. Specifically, the protrusion part 230 is formed such that it extends in one direction and bends outward in another direction by a predefined length from an upper end part of the fixing unit so that a middle part thereof is placed on an upper part of the bath 30. The protrusion part 230 may bend outward at substantially a right angle.

An interval between the side supporters 22 of both sides in the wafer guide 20 is adapted to become smaller than an interval between the holder units 13 in the close operation state of the robot chuck 10. That is, in the wafer chucked by the holder unit 13 of the robot chuck 10, a lower part of the wafer is contacted rather than both side surfaces thereof, but a portion of the wafer contacted with the side supporter 22 of the wafer guide 20 is a portion lower than a portion contacted with the holder unit 13. An interval between the contacted portions becomes narrower in the wafer guide 20 than in the robot chuck 10.

Further, the length of the lower supporter 21 and the side supporters 22 may beneficially be the same as or longer than the holder unit 13 of the robot chuck 10. A stopper 24 is structured and arranged in the fixing unit 23, to control a close operation of the robot chuck 10.

The stopper 24 is formed to have a length longer than an interval between both holder units 13, becoming distanced in the close operation of the robot chuck 10. Further, an interval between the stoppers 24 is formed to have a longer length than a length of the holder unit 13 of the robot chuck 10. That is, when the robot chuck 10 is normally loaded into the wafer guide 20, the holder units 13 of the robot chuck 10 can be stably raised and lowered between the stoppers 24, and the robot chuck 10 can stably chuck and transfer the wafers in the normal open/close operation of the robot chuck 10.

The stoppers 24 are individually adapted in the fixing units 23 of both sides. The stoppers 24 are structured and arranged with the length longer than an interval between the holder units 13 in the close operation of the robot chuck 10 and with the length shorter than an interval between the holder parts 13 in the open operation. A spaced distance between the stoppers 24 adapted in the fixing units 23 of both sides is longer than a length of the holder unit 13 adapted in the robot chuck 10.

The stoppers 24 may be disposed on mutual opposite outer surfaces of the fixing units 23 of both sides in the wafer guide 20, and may be formed in one body with the fixing part 23, or may be formed adhering to the fixing unit part 23 by using a specific adhesive, or may be coupled to the fixing unit part 23 using a bolt fastening.

In addition, the wafer guide 20 is soaked in cleaning solution of the bath 30. Thus, material of the wafer guide 20 should be selected by considering any potential chemical reaction caused by the cleaning solution. Whether the stopper 24 is formed in one body with the fixing unit 23 or not, it is preferable that the stopper 24 is formed of the same material as the wafer guide 20 in view of any potential chemical reactions caused by the cleaning solution. Preferably, the stopper 24 is formed of Teflon, quartz, or PEEK (polyetheretherketone).

Figure 4:
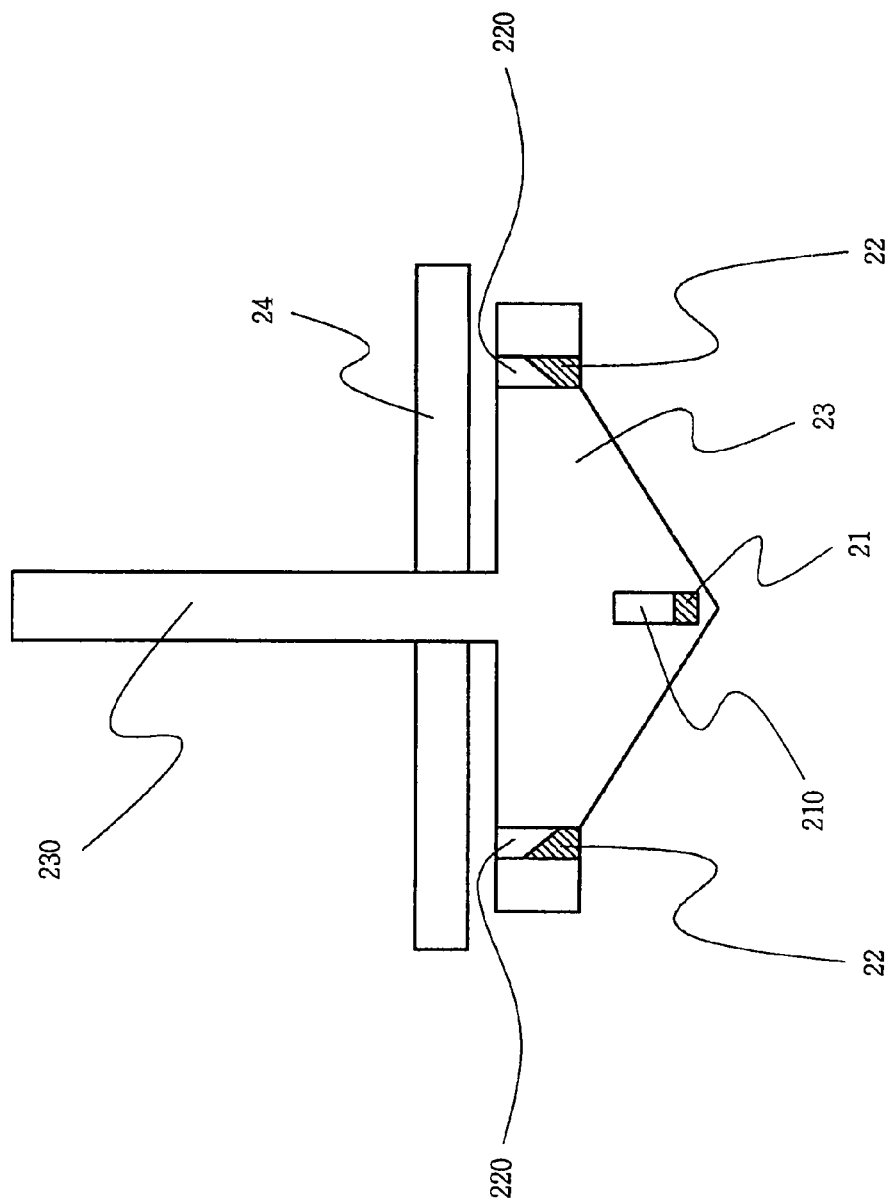
FIG. 4 is a vertical sectional view illustrating another embodiment of a stopper structured and arranged in a wafer guide according to an embodiment of the invention.

FIG. 4 is a vertical sectional view illustrating another embodiment of a stopper structured and arranged in a wafer guide according to an embodiment of the invention. The stopper 24 may be structured in various configurations. For example, the stopper 24 may be structured and arranged on an outer side surface opposite to an inner side surface of the fixing unit 23. The stopper 24 may be disposed between the lower supporter 21 and the side supporters 22, or flush with the side supporters 22. Alternatively, the stopper 24 may be structured and arranged with (or coupled to) a protrusion part 230 formed in an upper end part of the fixing unit 23 as shown in FIG. 4.

In the wafer guide 20, the protrusion part 230 may be formed to extend to a predefined height from an upper middle part of the fixing unit 23 that couples the lower supporter 21 to the side supporters 22, so that the wafer guide 20 is fixed to the bath 30. Thus, the protrusion part 230 may be combined with the stopper 24 at a predefined height and length.

Figure 5:
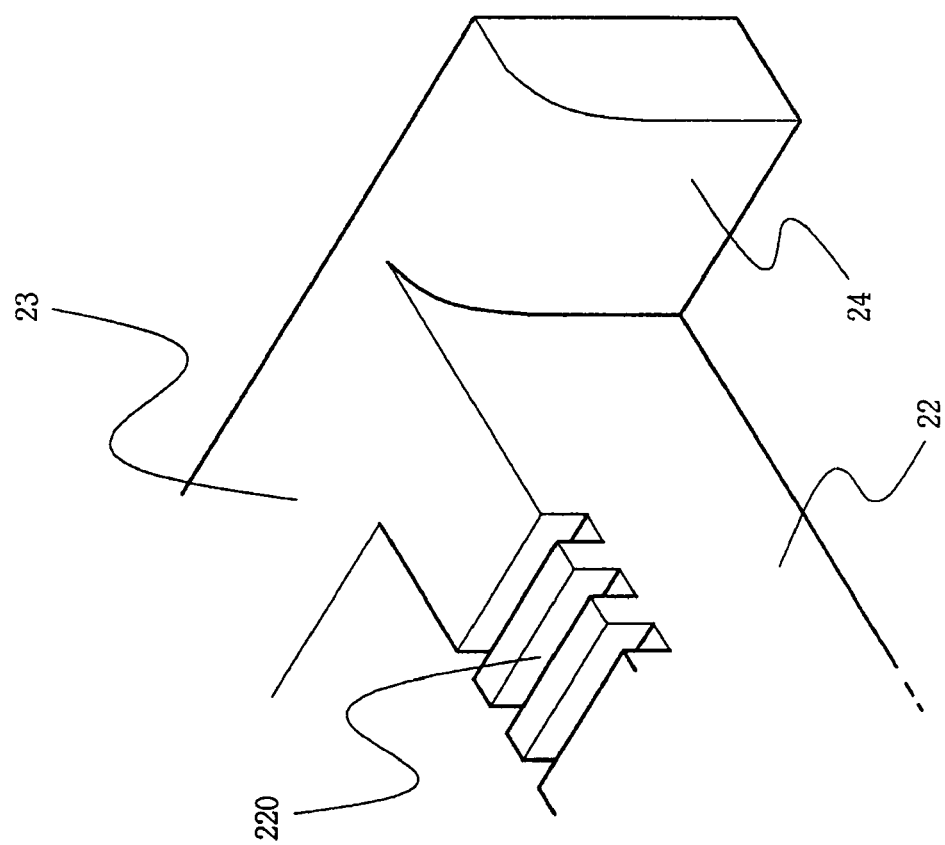
FIG. 5 is a perspective view illustrating a portion of the stopper in a wafer guide according to an embodiment of the invention.

FIG. 5 is an enlarged perspective view illustrating a portion of the stopper in the wafer guide according to an embodiment of the invention. The stopper 24 may be beneficially formed such that it protrudes a predefined length from both end parts of the fixing unit 23 along a side direction thereof. In the extended side end parts of the stopper 24, an edge of an upper end part of an inner side surface opposite to holders 13 of the robot chuck 10 may be formed with a curved surface to prevent collisions, as further explained below.

The holder unit 13 of the robot chuck 10 is positioned between the stoppers 24 structured and arranged at both sides of the wafer guide 20, moving toward the wafer guide 20. But when one end of the holder unit 13 moves excessively toward one stopper 24 and thus is positioned at an outer side (not at an inner side) of the stoppers 24, one side end part of the holder unit 13 would otherwise collide with an upper end surface of the stopper 24 while the robot chuck 10 is lowered.

For example, when an inner side edge of an upper end part of the stopper 24 has a protruded, angled shape, the holder unit 13 of the robot chuck 10 collides with an upper end surface of the stopper 24 so as not to be lowered any more. Thus, the holder unit 13 of the robot chuck 10 may be severely damaged due to a drop pressure of the robot chuck 10.

Figure 6:
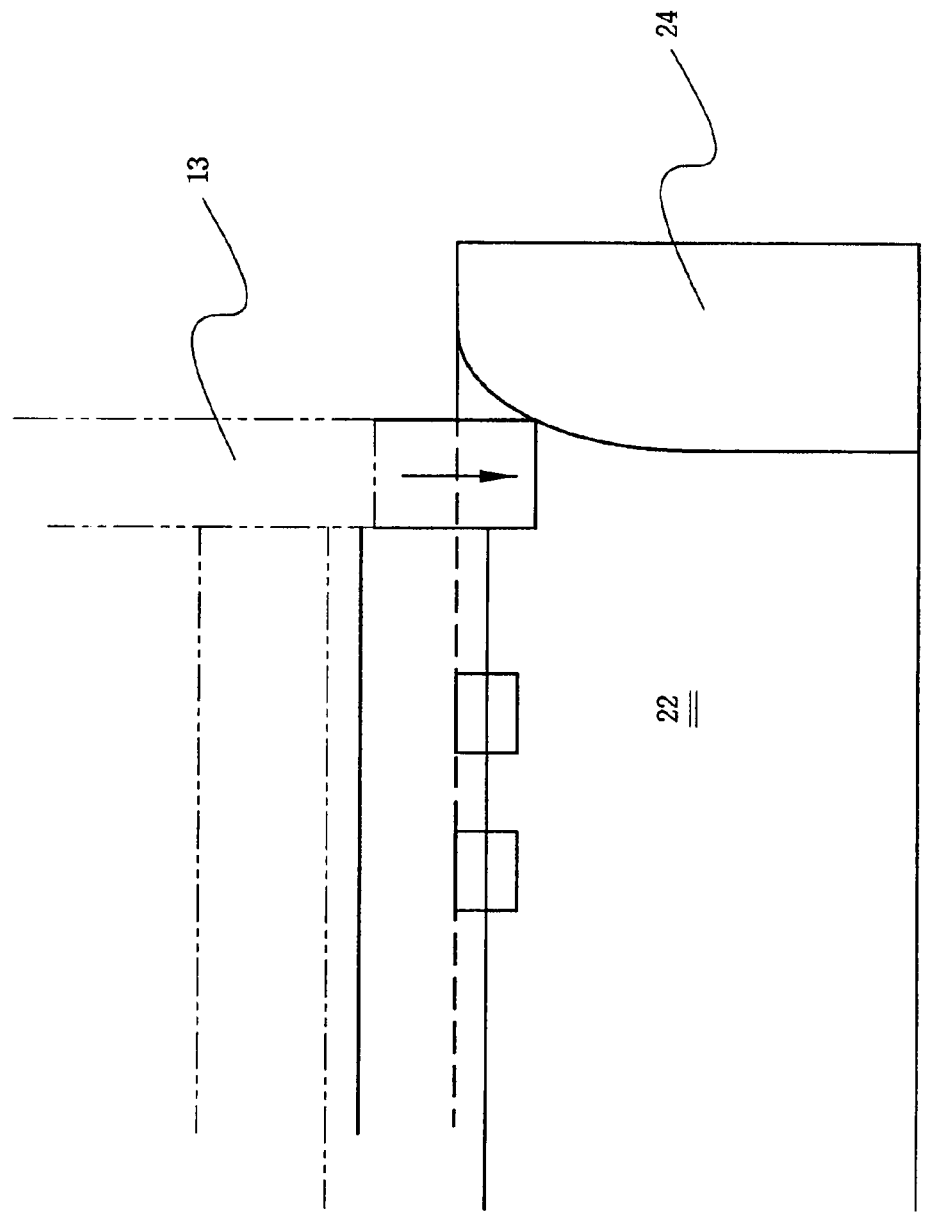
FIGS. 6 and 7 illustrate an operation to load the robot chuck into a wafer guide, being deviated from a normal alignment range.

When an inner side edge of an upper end part of the stopper 24 is processed to have a curved surface as shown in FIGS. 5 and 6, and even though the holder unit 13 of the robot chuck 10 is loaded into the wafer guide 20, being deviated from a normal position, the end part of the holder unit 13 slightly pushes against the stopper 24, sliding along the curved surface of the stopper 24 through the drop pressure of the robot chuck 10. As a result, the holder unit 13 can reach a normal drop position. Thus, the holder unit 13 is prevented from being damaged.

Figure 7:
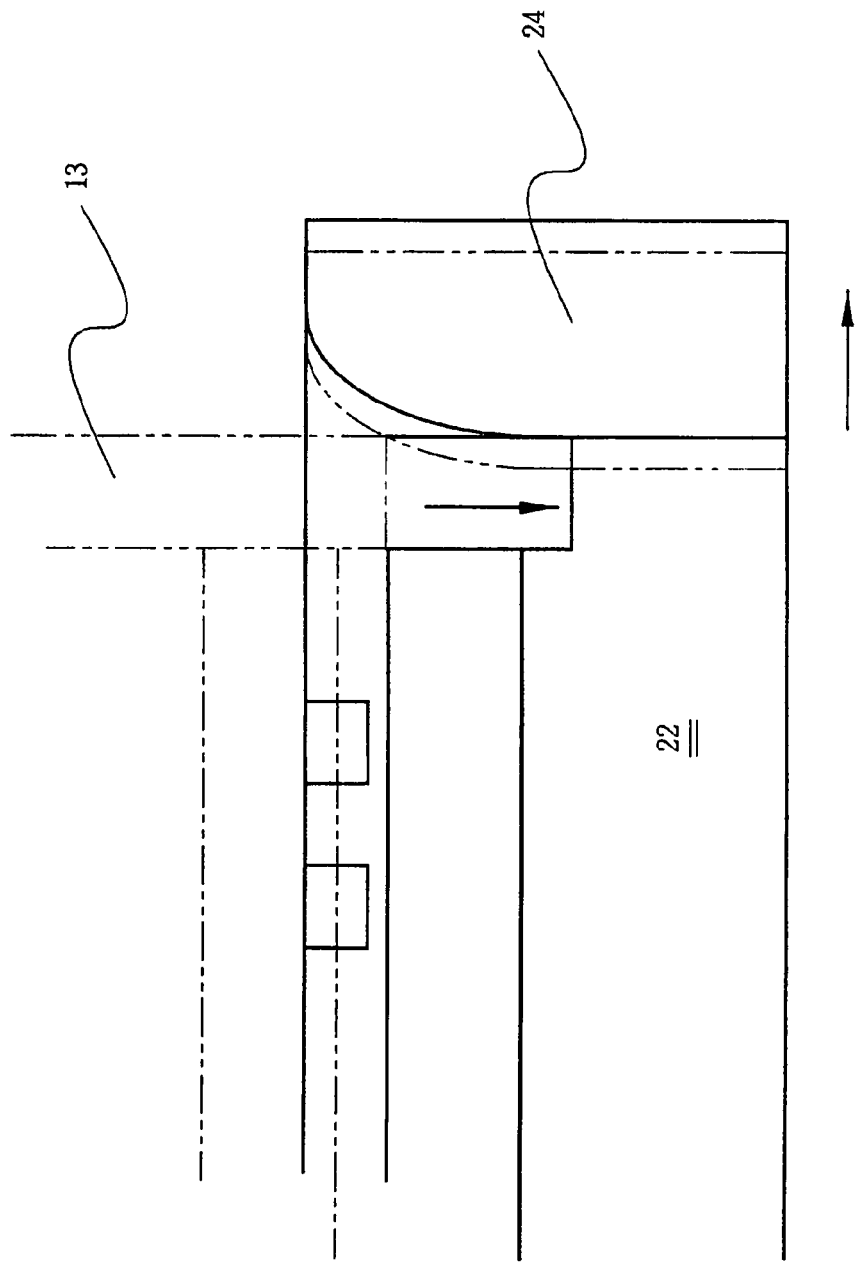

FIGS. 6 and 7 illustrate an operation to load the robot chuck into a wafer guide, being deviated from a normal alignment range. After a series of processes are performed, wafers are stacked in a cassette, and wafers stored in the cassette are simultaneously chucked and transferred by the robot chuck 10.

Rotary units 12 of both sides are rotated by the robot chuck 10 so that the holder units 13 move in mutual opposite directions to have an open state, and then close to simultaneously chuck a plurality of wafers stacked in the cassette.

At this time, the width and interval of slots of the cassette and slots 130 formed in the holder unit 13 of the robot chuck 10 are substantially the same. As a result, the wafers stored in the cassette can be strongly chucked in the holder unit 13 of the robot chuck 10.

As described above, the wafers can be chucked simultaneously in a batch unit and transferred by the robot chuck 10. The robot chuck 10 chucking the wafers of the batch unit moves to the bath 30 of the cleaning apparatus filled with cleaning solution, and is lowered from an upper part of the bath 30 toward the wafer guide 20 soaked inside the bath 30 using a drive motor.

In the robot chuck 10 and the wafer guide 20, slots 210 and 220 formed in the lower supporter 21 and the side supporter 22, respectively, of the wafer guide 20, and slots 130 formed in the holder unit 13 of the robot chuck 10 are positioned on substantially the same horizontal line through the exact chucking position thereof. Thus, the robot chuck 10 is stably dropped and can stably transfer wafers to the wafer guide 20 through the open operation.

When the wafers are stacked in the wafer guide 20, the robot chuck 10 rises in the open operation state and so becomes distant from the bath 30. When the cleaning operation of wafers is completed in the wafer guide 20, the robot chuck 10 is again lowered in the open operation. Thereafter, when the robot chuck 10 reaches a chucking position in the upper part of the wafer guide 20, the robot chuck 10 chucks wafers stacked in the wafer guide 20 by performing a close operation.

At this time, the loaded robot chuck 10 becomes exactly aligned with the wafer guide 20 and so the wafers can be stably chucked in the holder unit 13 through a normal close operation of the robot chuck 10. But when the robot chuck 10 is deviated by some levels from the wafer guide 20 in its loading operation, the close operation of the robot chuck 10 is not normally performed.

That is, when the robot chuck 10 excessively moves toward the stopper 24 of one side during the loading operation, the robot chuck 10 and the wafer guide 20 are abnormally aligned and thus the holder unit 13 is blocked by a side end part of the stopper 24 in the event of the close operation of the robot chuck 10.

FIG. 8 is plan view illustrating an error state in a close operation of robot chuck according to an embodiment of the invention. A normal close operation of the robot chuck 10 cannot be performed any longer when the outer side part of the stopper 24 collides with the robot chuck 10. That is, when the robot chuck 10 causes a close operation error, a sensor built in the elevating unit 11 of the robot chuck 10 senses the operation error, and determines that a wafer chucking error has occurred, and then promptly stops the process.

As a result, wafers stacked in the wafer guide 20 cannot be chucked by the robot chuck 10, thereby preventing a wafer breakage caused by a wafer chucking in an abnormal alignment state of the robot chuck 10 and the wafer guide 20.

For example, when the drive of the equipment is stopped due to an alignment error of the robot chuck 10 and the wafer guide 20 while the robot chuck 10 is loaded into the wafer guide 20 in the process execution, an operation of manually moving the robot chuck 10 or the wafer guide 20 to load the robot chuck 10 into the wafer guide 20 is repeatedly performed to correct the error, after which the equipment can be re-driven.

Meanwhile, even though in a close operation state where the robot chuck 10 chucks wafers, the robot chuck 10 is loaded into the wafer guide 20, excessively moving toward the stopper 24 structured and arranged at one side of wafer guide 20, such that a descent operation of the robot chuck 10 can be performed normally.

That is, in an upper surface of the stopper 24 contacted with an end part of the holder unit 13 of the robot chuck 10, an edge portion of an inner side of the stopper 24 is formed with a curved surface with which the holder unit 13 is contacted. When the end part of the holder unit 13 is operatively contacted with the curved surface, the holder unit 13 is lowered by force along the edge of curved surface of the stopper 24 using an elevation drive motor of the robot chuck 10. At this time, the stopper 24 is pushed out corresponding to a level of width overlapping vertically with the holder unit 13.

After the holder unit 13 of the robot chuck 10 descends in a relatively high level in the close operation state, the robot chuck 10 performs an open operation to transfer wafers to the wafer guide 20. At this time, one side end surface of the holder unit 13 already closely adheres to the stopper 24. In other words, the robot chuck 10 never opens even though the open operation is performed by driving a cylinder adapted to perform the open/close operation of the robot chuck 10. When such open operation error is sensed through a sensor, the process can be interrupted.

Accordingly, when the robot chuck 10 is deviated by some levels while the robot chuck is loaded into the wafer guide 20, the holder unit 13 moving toward the stopper 24 of one side, the open operation itself of the robot chuck 10 cannot be done, thereby preventing a stack error of wafers causable by a discord between slots during transferring wafers to the wafer guide 20.

Meanwhile, when the robot chuck 10 is loaded so that one side end surface of the holder unit 13 is placed to have substantially the same vertical line as an inner side surface of the stopper 24, the one side end surface of the holder unit 13 is weakly in contact with the stopper 24, and thus, the open operation of the robot chuck 10 may be normally performed using the drive of the cylinder.

Even though the robot chuck 10 is loaded so that a normal open operation is effective, the robot chuck 10 and the wafer guide 20 have already been mutually deviated from a normal alignment range, and so slots of the robot chuck 10 and the wafer guide 20 already have a mutually deviated state.

Thus, when an open operation of the robot chuck 10 is normally performed and wafers stacked in the robot chuck 10 are transferred to the wafer guide, a wafer stack error is caused in the wafer guide 20 and a plurality of wafers are down in the wafer guide 20.

When in the wafer guide 20, the stack error of wafers occurs, and even though an open operation of the robot chuck 10 is normal, the robot chuck 10 is again loaded in the wafer guide 20 in the open operation state immediately after a wafer cleaning that is performed in the bath 30. Then a close operation for a chucking of wafers stacked in the wafer guide 20 is performed. At this time, one side end part of the holder unit 13 of the robot chuck 10 is blocked by a side end surface of the stopper 24 of one side, causing a close operation error.

In other words, even though the robot chuck 10 is loaded into the wafer guide 20 in the close operation state so that one side end part of the holder unit 13 is positioned on substantially the same vertical line as an inner side surface of the stopper 24, and even though an open operation of the robot chuck 10 is normally performed, operation errors may nevertheless occur. For example, in the close operation, one side end part of the holder unit 13 is blocked even minutely by a side end surface of the stopper 24 to generate a close operation error, thereby stopping the process.

As described above, in various embodiments of the invention, when the robot chuck 10 is loaded into the wafer guide 20, being excessively moved toward one stopper 24, and thus it becomes deviated from a normal alignment range, and when one end of the holder unit 13 of the robot chuck 10 and the inner side surface of the stopper 24 are in contact with or overlapped with each other on a vertical line, a wafer chucking through the robot chuck 10 is not performed because of an error in the open/close operation of the robot chuck 10, thereby automatically stopping a process execution.

In a normal alignment range of the robot chuck 10, the holder unit 13 is positioned between both stoppers 24 of the wafer guide 20 in a way that both end parts of the holder unit 13 are distanced from the inner side surface of the stopper 24. In other words, the normal alignment range corresponds to the holder units of the robot chuck having a sufficient distance from inner side surfaces of the stoppers so as to freely pass there between. But while the process is performed for a long time, the robot chuck 10 or the wafer guide 20 may experience fine movements, being deviated from the normal alignment range.

When there exists a contacted or vertical overlapped portion between the holder unit 13 of the robot chuck 10 and the stopper 24 of the wafer guide 20, the slots between the robot chuck 10 and the wafer guide 20 are out of the alignment. At this time, a precise transfer of wafers is difficult, causing an error in the stacking of wafers and furthermore causing wafer breakage in the chucking operation of the robot chuck 10.

Thus, when an alignment error of the robot chuck 10 and the wafer guide 20 is caused, a wafer breakage causable during the wafer chucking operation can be prevented by inducing an error in the close operation of the robot chuck 10, thereby preventing a loss of wafers.

In particular, there has been a disadvantage that much time was consumed until maintenance is performed and the equipment is re-driven after an occurrence of wafer breakage in the conventional art. Meanwhile, according to embodiments of the invention, the maintenance can be performed more easily and more rapidly by sensing an alignment error between the robot chuck 10 and the wafer guide 20 before an occurrence of wafer breakage, thereby substantially reducing time taken to re-drive the equipment and as a result, increasing productivity.

In addition, in an alignment error of the robot chuck 10 and the wafer guide 20 during the process or in a regular or irregular position control of the robot chuck 10 and the wafer guide 20, a contact and collision between the holder unit 13 and the stopper 24 can be checked while the robot chuck 10 is simply loaded into the wafer guide 20.

As described above, according to embodiments of the invention, when the robot chuck 10 and the wafer guide 20 have an abnormal alignment state, a wafer breakage causable in a wafer chucking of the robot chuck 10 can be prevented by purposefully generating an error in a close operation of the robot chuck 10, and in addition, a precise position control of the robot chuck 10 and the wafer guide 20 can be performed in the regular or irregular checking.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A wafer guide to prevent a wafer from being broken in a semiconductor cleaning apparatus, the wafer guide comprising:
   a lower supporter having a plurality of lower slots, the lower slots having substantially the same interval in a length direction to vertically stand a plurality of wafers thereon;
   side supporters that are structured and arranged in parallel at both sides of a same horizontal line above the lower supporter, the side supporters having side slots corresponding to the lower slots of the lower supporter, the side supporters having substantially the same length in the length direction as the lower supporter, the side supporters being structured to support side end parts of the wafers;
   fixing units structured and arranged to solidly couple with the lower supporter and the side supporter the fixing units having first surfaces facing each other therebetween and second surfaces opposite to the first surfaces and supportinq the lower supporter and the side supporters through the first surfaces; and
   stoppers that are fixedly coupled to the fixing units through the second surfaces, the stoppers crossing end parts of the side supporters.

2. The wafer guide of claim 1, wherein the stoppers protrude a predefined length from the fixing units along a side direction thereof.

3. The wafer guide of claim 1, wherein the fixing units include protrusion parts, respectively, the protrusion parts being in one body with the fixing units, being disposed on the lower supporter and extending upward from upper middle parts of the fixing units.

4. The wafer guide of claim 1, wherein the stoppers are formed in one body with the fixing units.

5. The wafer guide of claim 1, wherein the stoppers are combinable with the fixing units and are separable from the fixing units.

6. The wafer guide of claim 1, wherein the stoppers are formed of the same material as the fixing unit.

7. The wafer guide of claim 1, wherein inner side edges of an upper end part of the stoppers have a curved surface.

8. A semiconductor cleaning apparatus comprising:

a robot chuck including an elevating unit and holding units;

a wafer guide disposed under the robot chuck and in a bath, the wafer guide having:
- a lower supporter having first slots thereon, the first slots vertically standing wafers;
- side supporters having second slots corresponding to the first slots of the lower supporter, the side supporters having substantially the same length in the length direction as the lower supporter, the side supporters being structured to support side end parts of semiconductor wafers;
- fixing units that are structured and arranged to solidly couple with the lower supporter and the side supporters, the fixing units having first surfaces facing each other therebetween and second surfaces opposite the first surfaces, and supporting the lower supporter and the side supporters through the first surfaces; and
- stoppers that are fixedly coupled to the fixing units through the second surfaces, the stoppers crossing end parts of the side supporters, wherein a sensor in the elevating unit is adapted to sense an alignment error between the holding units and the stoppers when a robot chuck is loaded into the wafer guide.

9. The semiconductor cleaning apparatus of claim 8, wherein the stoppers are disposed such that a distance between them is longer in size than a length of each of the holder units of the robot chuck.

10. The semiconductor cleaning apparatus of claim 8, wherein a length of each of the stoppers is longer in size than a distance between the holder units during a close operation of the robot chuck.

11. The semiconductor cleaning apparatus of claim 8, wherein a length of each of the stoppers is shorter in size than a distance between the holder units during an open operation of the robot chuck.

12. The semiconductor cleaning apparatus of claim 8, wherein when the robot chuck is deviated a predetermined alignment range with respect to the stoppers, the robot chuck stopping a wafer chucking.

13. The semiconductor cleaning apparatus of claim 8, wherein the stoppers protrude a predefined length from the fixing units along a side direction thereof.

* * * * *